United States Patent [19]

Batruni

[11] Patent Number: 5,568,411
[45] Date of Patent: Oct. 22, 1996

[54] METHOD AND APPARATUS FOR USING POLARITY-COINCIDENCE CORRELATORS IN LMS ADAPTIVE FILTERS

[75] Inventor: Roy G. Batruni, Fremont, Calif.

[73] Assignee: National Semiconductor Corporation, Santa Clara, Calif.

[21] Appl. No.: 279,545

[22] Filed: Jul. 25, 1994

[51] Int. Cl.$^6$ .................................................. G06F 15/31
[52] U.S. Cl. .................................................. 364/724.19
[58] Field of Search ........................... 364/724.19, 724.2

[56] References Cited

U.S. PATENT DOCUMENTS

| | | | |
|---|---|---|---|
| 4,467,441 | 8/1984 | Gritton | 364/724.19 |
| 4,589,083 | 5/1986 | Le Dinh et al. | 364/724.19 |
| 4,831,602 | 5/1989 | Kroenert et al. | 364/724.03 |

*Primary Examiner*—Tan V. Mai

*Attorney, Agent, or Firm*—Limbach & Limbach L.L.P.

[57] ABSTRACT

A method of updating the coefficients of an adaptive filter, where the filter utilizes a polarity-coincidence correlator (PCC) as part of an iterative update equation. The expression for the standard PCC correlator is modified to correct for its inherent distortion by operating on the update term with a factor of the form of sin [$\pi/2$ (f)], where f represents the PCC correlator. This produces an update equation and correlator which behaves like the well known least mean square (LMS) update algorithm in many respects, but is simpler and more cost-effective to implement in many situations. Architectures for both a direct form and transpose form implementation of the present invention are also disclosed. An adaptive filter based on the present invention will exhibit a very robust convergence behavior, although it will be slower than that of a standard LMS based filter. In addition, the steady state noise of the filter can be made to approach the theoretical minimum.

9 Claims, 4 Drawing Sheets

METHOD AND APPARATUS FOR USING POLARITY-COINCIDENCE CORRELATORS IN LMS ADAPTIVE FILTERS

FIELD OF THE INVENTION

The present invention relates to methods and apparatus for updating the coefficients of an adaptive filter in an iterative fashion to cause a convergence between the characteristics of the filter and those of a channel through which an input signal is propagating. This process is typically carried out to modify a control signal used to assist with the sampling of the input signal, or to perform adaptive noise cancelling in order to provide an estimate of a signal which has been corrupted by additive noise.

BACKGROUND OF THE INVENTION

Adaptive filters are used in many applications where it is desired to isolate one signal from another or to remove noise from a desired signal in order to process it and extract information. For instance, in telecommunications or data processing systems it is necessary to sample an incoming signal in order to decode the signal and obtain information from it. This sampling must be carried out at the proper frequency to extract the information from the signal in an optimal manner. This requires accurate control of the sampling process so that it can be modified as needed in accordance with the characteristics of the incoming signal. A standard means of controlling the sampling process is through the use of an adaptive filter.

In such an application, an adaptive filter operates on an incoming signal at time n, x(n), to produce an output at time n, $\hat{y}(n)$, where the input and output are related by the impulse characteristics of the filter. These filter characteristics are described by a set (or vector) of adaptive filter coefficients, $\hat{H}(n)$, having components $\hat{h}_i(n)$, with the filter, the input, and the output being related by:

$$\hat{y}(n) = X(n)^T \hat{H}(n), \tag{1}$$

where $X(n)^T$ is the transpose of the vector $X(n)$ having components $x(n)$, $$X(n)^T = [x(n), x(n-1), \ldots x(n-m+1)], \text{ and } \hat{H}(n)^T = [\hat{h}_0(n), \hat{h}_1(n), \ldots \hat{h}_{m-1}(n)]. \tag{2}$$

Equation (1) describes an output which is the dot product of the two vectors $X(n)$ and $\hat{H}(n)$, where in this situation the dot product represents the convolution of the input signal and the adaptive filter coefficients:

$$\hat{y}(n) = \sum_{i=0}^{m-1} x(n-i)\, \hat{h}_i(n),$$

where m is the number of coefficients in the adaptive filter.

As indicated by equation (2), an adaptive filter can be described by a sequence of m filter coefficients, where the coefficients may be a function of time. The typical problem encountered is one of updating the filter coefficients in a manner which leads to a convergence between the result of applying the adaptive filter to an input signal and the output of a channel through which the signal has propagated. If the channel is characterized by its impulse response as a function of time, H(n), where $$H(n)^T = [h_0(n), h_1(n), \ldots h_{m-1}(n)], \tag{3}$$

then the result of propagating a signal X(n) through the channel is given by the channel output, Y(n), where the components y(n) of Y(n) are given by the dot product (convolution) of X(n) and H(n):

$$y(n) = X(n)^T H(n). \tag{4}$$

If the difference between the channel output and the adaptive filter output is defined to be an error term, e(n), where $$e(n) = y(n) - \hat{y}(n), \tag{5}$$

then the problem can be expressed as one of iteratively updating the adaptive filter coefficients so as to minimize e(n). The expression describing the minimal value of e(n) can take several forms, depending upon the metric selected to represent a minimum, e.g., the absolute value of e(n), the mean square value of e(n), etc.

The general situation is depicted in FIG. 1, which shows a signal X(n) being input to an adaptive filter 10 and a channel 12, with the outputs of filter 10 and channel 12 being differenced by a comparator 14, thereby producing an error term e(n). In the usual case, e(n) is then fed back to filter 10 to cause an updating of the filter coefficients. This iterative process is continued until the filter coefficients have converged to a sufficient approximation of the channel response, i.e., $|f\{e(n)\}|$ is small, where $f\{e(n)\}$ is some function of e(n) which is being minimized.

Adaptive filters can also be used to perform noise cancellation. In this use of adaptive filters, an input signal representing a desired signal which is corrupted by additive noise is compared with a reference signal. The reference signal is selected so that it represents a good estimate of the noise source with minimal contribution from the desired signal. The reference signal is filtered and subtracted from the combined signal and additive noise to form an output signal. If the desired signal is s, the additive noise is $n_o$, the reference signal is $n_1$, and the filtered reference signal is y, then the output signal z is given by:

$$z = s + n_o - y, \tag{6}$$

where y results from the operation of an adaptive filter on $n_1$.

If y is adjusted to be a sufficiently "good" estimate of the noise term $n_o$, then the output signal (z) will become a better estimate of the desired signal (s). This is accomplished by feeding the output signal back into an adaptive filter as an error signal and iteratively updating the adaptive filter coefficients until an acceptable result is obtained. In this application of an adaptive filter, the desired set of filter coefficients is one which causes the filtered reference noise signal to approach the actual noise added to the desired signal. When this occurs, the additive noise term is effectively "cancelled" and the actual desired signal is obtained.

Updating the coefficients of an adaptive filter is usually carried out by a method which iteratively updates each coefficient as the time increments from time (n) to time (n+1). A general form of an update equation is given by:

$$\hat{H}(n+1) = \hat{H}(n) + g(n)\, f_1(e(n))\, f_2(X(n)), \tag{7}$$

where g(n) is a gain term and $f_1$ and $f_2$ are generalized functions of the indicated variables.

A well-known adaptation equation having the form shown in equation (7) is the Least Mean Squares (LMS) algorithm which is intended to adjust the coefficients of an adaptive filter so as to minimize the mean-square error. Since the mean-square error is a quadratic function of the weights, adjusting the coefficients to minimize the mean-square error can be visualized as attempting to reach the bottom of a hyper-paraboloidal surface by descending along its sides. As is well known, gradient methods are typically used to accomplish this goal. The LMS algorithm is an implementation of one of these gradient methods known as the method of steepest descent, and in terms of the components $\hat{h}_j(n)$ of the vector $\hat{H}(n)$ is described by:

$$\hat{h}_j(n+1) = \hat{h}_j(n) + 2\,\mu e(n)x(n-j), \qquad (8)$$

where $\mu$ is the adaptation step size which controls the rate of convergence. Equation (8) can be expressed in vector form as:

$$\hat{H}(n+1) = \hat{H}(n) + 2\,\mu e(n)X(n).$$

The $e(n)x(n-j)$ term in equation (8) represents an error-signal correlator. As will be discussed later, other types of correlators, such as sign-sign, sign-error, and sign-signal have also been used to update the filter coefficients in adaptive echo cancelers and equalizers.

FIG. 2 is a block diagram of a device for implementing an adaptive filtering scheme based on the LMS algorithm. In FIG. 2, an input signal 100 represented by $X_j$ has components $X_{ij}$, where (i=1, ... ,n). Each $X_{ij}$ component is fed to a multiplier 110 as well as to adaptive filter 120. The multipliers 110 act to weight the input signal components by weighting terms $W_{ij}$ to produce a set of product terms, $X_{ij}W_{ij}$. These weighted terms are summed by integrator 130 and provided to both the filter output and to a comparator 140.

A desired response signal 142 is also input to comparator 140, which differences the filter output and desired response to obtain an error signal. The error signal is fed back to adaptive filter 120 which then implements a desired update algorithm to update the filter coefficients. The updated filter coefficients then become the new weighting terms used by integrators 130. This iterative process is continued until the filter coefficients converge to an acceptable value. Note that in some applications, such as the use of the LMS algorithm, all of the $X_{ij}$ inputs may be derived from a signal which is put through a delay line, so that each input term is a sample of the same signal corresponding to a different time.

In addition to the LMS algorithm, other update equations have also been investigated. A more general expression for an update equation for the coefficients of an adaptive filter is described by:

$$\hat{h}_j(n+1) = \hat{h}_j(n) - 2\,\mu Q([e(n)x(n-j)], \qquad (9)$$

where $Q[\ ]$ is a generalized function of $e(n)x(n-j)$ and $\mu$ is again the adaptation step size, the value of which can be selected to assure convergence. Equation (9) describes how a particular filter coefficient is updated from time (n) to time (n+1). In using an update equation, the error term given in equation (5) is often modified to include a term, u(n), which represents additive gaussian noise. In this case, equation (5) takes the form:

$$e(n) = y(n) - \hat{y}(n) + u(n). \qquad (5a)$$

The generalized function $Q[\ ]$ may be non-linear and can take many forms, examples of which are given below:

$$Q_1[e(n)x(n-j)] = e(n)x(n-j) \qquad (10)$$

$$Q_2[e(n)x(n-j)] = sgn[e(n)]x(n-j) \qquad (11)$$

$$Q_3[e(n)x(n-j)] = e(n)sgn[x(n-j)] \qquad (12)$$

$$Q_4[e(n)x(n-j)] = sign[e(n)]sgn[x(n-j)] \qquad (13)$$

where $sgn[z]=1$ if $z \geq 1$, and $sgn[z]=-1$ if $z<1$. Equation (13) is known as the Polarity Coincidence Correlator (PCC).

Compared to other update algorithms, the LMS update algorithm has the advantage that if it were implemented with infinite bit precision, it would have the fastest convergence of the commonly used update functions. However, in actual situations when it is implemented with finite bit precision, it may not be not as well-behaved as desired. In a digital implementation of the LMS algorithm, when convergence starts, $e(n)$ is large and $\mu$ is typically fixed at $\mu=1/(2^{11})$. The coefficients $\hat{H}(n)$ are 24 bits wide (1 sign bit+23 magnitude bits). The product $p=\mu e(n)$ is equivalent to shifting $e(n)$ to the right by 11 places and, initially, when $e(n)$ is large, p is still on average such that $|p|>1/(2^{23})$ and, therefore, this update is "seen" by $\hat{H}(n)$. However, as convergence progresses and $e(n)$ becomes smaller as desired, $|p|<1/(2^{23})$ and the coefficients $\hat{H}(n)$ are not being updated anymore. Therefore, convergence is not optimal, since by using more than 24 bits for $\hat{H}(n)$, convergence could have continued and $e(n)$ could have been decreased further.

The LMS algorithm has also shown parameter drift properties that are described by Sethares et al. in "Parameter Drift in LMS Adaptive Filters", IEEE Transactions on Acoustics, Speech and Signal Processing, Vol. ASSP-34 No. 4, August 1986, and which have been observed in a working prototype. The problem is that, with bounded steady state inputs, the output $x(n)$ and the error $e(n)$ remain bounded and approximately zero, respectively, while the parameters $\hat{H}(n)$ drift away from $\hat{H}$ very slowly.

Another disadvantage of using LMS algorithms is that their hardware implementations require some degree of complexity. Since LMS algorithms require that the product of $e(n)X(n)$ be determined, multipliers are needed to carry out the calculation. This is in contrast to sign-based update equation implementations which are simpler because $sgn(e)$ or $sgn(x)$ equals plus or minus one.

Although update algorithms other than the LMS algorithm have been studied and used in adaptive filtering applications, the literature has noted that they also have disadvantages. It has been observed that convergence time, steady state residual error, or both are sacrificed in most implementations of sign correlators. The primary reason for these behaviors of sign algorithms is that $e(n)$ or $x(n)$ are approximated by their sign instead of their actual values. This slows down the convergence of the filter coefficients since the actual value is rarely equal to plus or minus one. Therefore, both families of correlators typically used in update equations incorporate non-optimal performance features.

In many applications which use adaptive filters, the quantity of interest is the power spectrum of a signal. The power spectrum is defined to be the fourier transform of the autocorrelation of a signal, that is the correlation of a signal with itself. If the propagation of a signal through a channel is viewed as a transformation operating on that signal, it is apparent that it is of some interest how the autocorrelation sequences (the autocorrelation coefficients of a signal for different times) of an input signal and a transformed signal are related. This problem has been solved and is expressed in terms of Price's Theorem, which states that given a stationary Gaussian zero mean continuous time series, $f(t)$, undergoing a memoryless non-linear transformation, $F[f(t)]$, to produce an output, $g(t)$, then if the autocorrelation sequence for $f(t)$ is $\rho_f(\tau)$, with $\tau$ being the correlation delay, the autocorrelation sequence for the output, $\rho_g(\tau)$, is related to $\rho_f(\tau)$ by:

$$\frac{\partial^k[\rho_g(\tau)]}{\partial[\rho_f(\tau)]^k} = \overline{F^k[f(t)]F^k[f(t+\tau)]}, \quad (14)$$

where $F^k$ denotes k derivatives with respect to f and the bar over the right hand side of equation (14) denotes the expected value.

For the sgn[z] function described above, i.e., F[f(t)]=sgn [f(t)], Price's Theorem indicates that the input and output correlation sequences are related according to:

$$\rho_f(\tau)=\sin(\pi/2\ \rho_g(\tau)). \quad (15)$$

If the continuous variable $\tau$ is replaced with a sequence of n time samples, the result given in equation (14) still holds and:

$$\rho_f(n)=\sin(\pi/2\ \rho_g(n)). \quad (16)$$

Equation (16) can be inverted to yield:

$$\rho_g(n)=2/\pi\ arc\sin(\rho_f(n)). \quad (17)$$

Using equation (9), the Polarity Coincidence Correlator coefficient update relationship given in equation (13) can be rewritten in vector form as $$\begin{aligned}\hat{H}(n+1) &= \hat{H}(n) + \mu\ \text{sgn}[e(n)]\text{sgn}[X(n)] \\ &= \hat{H}(n) + \mu\ \text{sgn}[e(n)X(n)] \\ &= \hat{H}(n) + \mu\ E\{\text{sgn}[e(n)X(n)]\} \\ &= \hat{H}(n) + \mu\ 2/\pi\ \arcsin(E\{[e(n)X(n)]\}),\end{aligned} \quad (18)$$

where E{ } represents the expected value of the indicated terms. Equation (18) clearly shows that a sgn[z] discontinuity produces a coefficient update equation which includes a distortion factor of the form (2/π arcsin [ ]). This means that an adaptive filter having coefficients modified according to a PCC iterative process will converge in an oscillating manner instead of approaching the final value(s) directly. This can present problems in some applications because the convergence will be slower than may be desired.

What is desired is a method of updating the coefficients of an adaptive filter which overcomes the disadvantages of the LMS or PCC type algorithms typically used, and an apparatus embodying the method.

SUMMARY OF THE INVENTION

The present invention is directed to a method of updating the coefficients of an adaptive filter, where the filter utilizes a polarity-coincidence correlator (PCC) as pan of an iterative update equation. The expression for the standard PCC correlator given by:

sgn[e(n)]sgn[X(n)]

is modified to correct for its inherent distortion by operating on the update term with a correction factor of the form sin [π/2 (f)], where f represents the PCC correlator. This produces an update equation and correlator which behaves like the well known LMS update algorithm in many respects, but is simpler and more cost-effective to implement in many situations. Architectures for both a direct form and transpose form implementation of the present invention are also disclosed. An adaptive filter based on the present invention exhibits very robust convergence behavior, although it will be slower than that of a standard LMS based filter. In addition, the steady state noise of the filter can be made to approach the theoretical minimum.

Further objects and advantages of the present invention will become apparent from the following detailed description and accompanying drawings.

DETAILED DESCRIPTION OF THE PREFERRED EMBODIMENT

Figure 1:
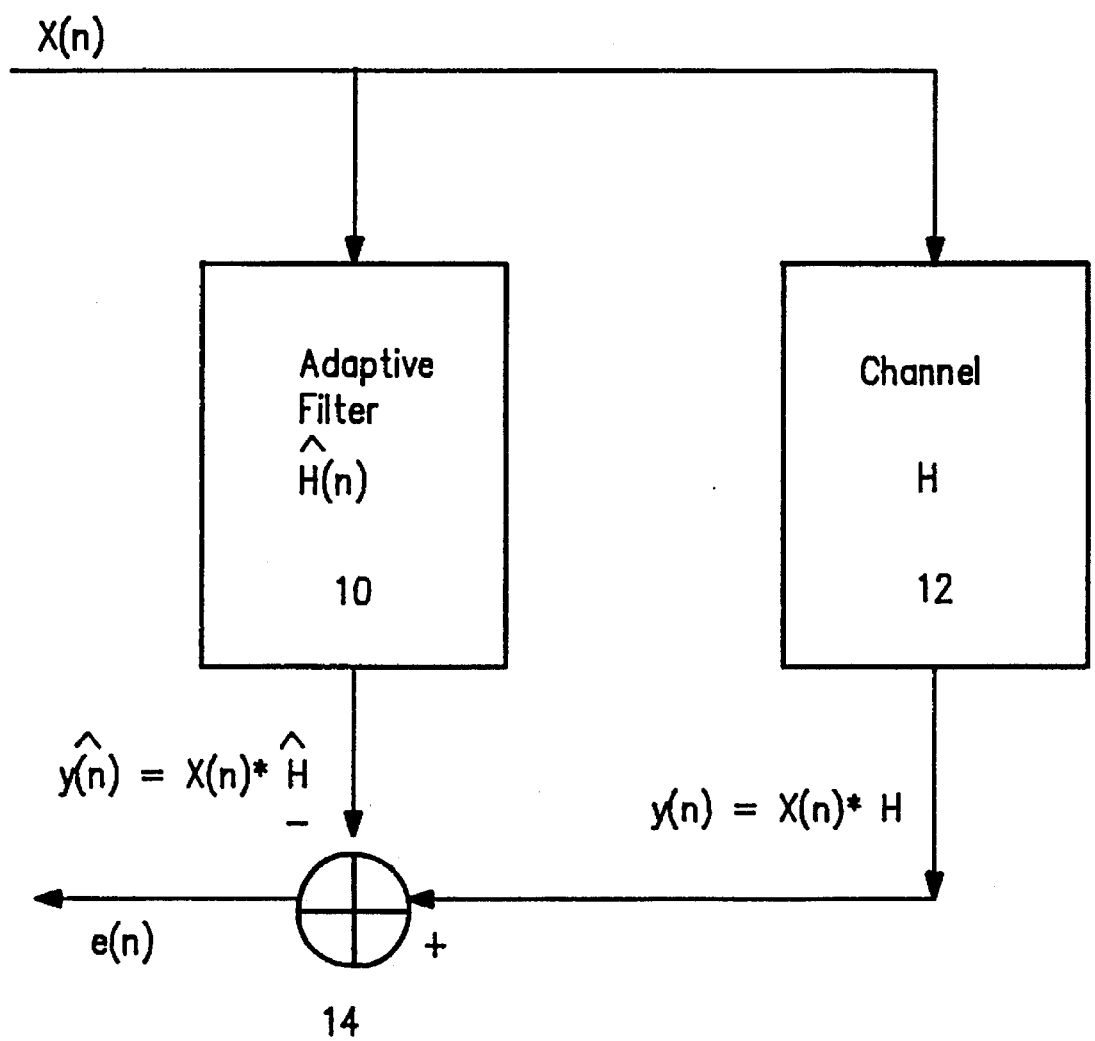
FIG. 1 is a simple block diagram illustrating a typical application of an adaptive filter.
Figure 2:
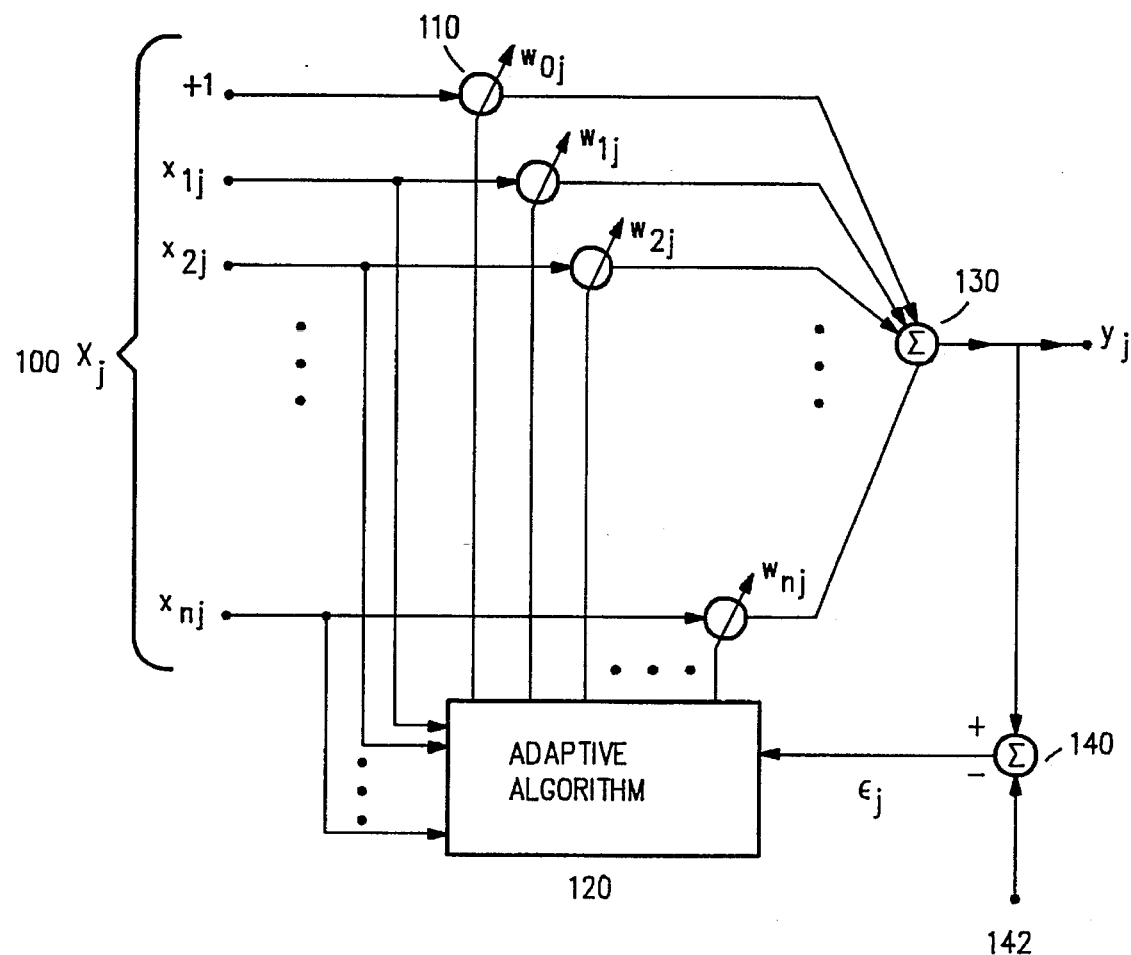
FIG. 2 is a block diagram of a device for implementing an adaptive filtering scheme, such as one designed to implement the LMS algorithm.

The inventor of the present invention has recognized that the distortion introduced by the use of the sgn[z] function in the Polarity Coincidence Correlator (PCC) update equation can be compensated for by introduction of correction terms into equation (18). If that equation is modified as shown below:

$$\hat{H}(n+1)=\hat{H}(n)+\mu\ \sin(\pi/2\bullet 2/\pi arc\sin(E\{[e(\ n)X(n)]\})), \quad (19)$$

then the resulting update equation becomes $$\hat{H}(n+1)=\hat{H}(n)+\mu(E\{[e(n)X(n)]\}). \quad (20)$$

Note that equation (20) is in the same form as a standard LMS update equation. This indicates that if the update terms obtained from using the sgn function are multiplied by π/2 and then operated on by the sine function, the distortion problem introduced by the sgn function can be eliminated and replaced by the behavior typically found in LMS-based algorithms.

Therefore, in accordance with the present invention, a distortion-corrected PCC adaptive filter is defined by the coefficient update relationship:

$$\hat{H}(n+j)=\hat{H}(n)\ j=1,\ldots,N-1 \quad (21)$$

$$\hat{H}(n+N)=\hat{H}(n)+\mu\hat{\Lambda}(n), \quad (22)$$

where the jth component of the vector $\hat{\Lambda}(n)$ is $$\hat{\Lambda}_j(n) = \left[\sin\left(\pi/2\left(1/N\sum_{i=0}^{N-1}\text{sgn}[e(n+i)]\text{sgn}[x(n+i-j)]\right)\right)\right]. \quad (23)$$

In accordance with the update method described by equations (21)–(23), the coefficients of the adaptive filter are updated once every N time samples. The sin (π/2) transformation appended to the sign-sign correlator makes the update terms equivalent to a full correlator via Price's Theorem. Thus, on average, the 2/π arcsin distortion factor present in typical sign-sign correlators is corrected for by using the method of this invention. Therefore, the update algorithm described herein gives a gradient estimate of E{e(n)X(n)} which is equal to the one obtained by using the LMS algorithm. Note that the sign-sign portion of the corrected PCC algorithm is computed over the N time periods when the filter coefficient is kept constant.

In order to investigate some of the properties of the update method of the present invention which is described by equations (21)–(23), define the vector $\hat{G}$ as:

$$\hat{G}_n = [\hat{g}_0, \ldots, \hat{g}_{L-1}]^T \qquad (24)$$

$$= 1/N \sum_{i=0}^{N-1} \text{sgn}\,[e(n+i)]\text{sgn}[X(n+i)], \qquad (25)$$

and therefore $$\hat{\Lambda}(n) = \sin(\pi/2\ \hat{G}_n), \qquad (26)$$

where it is understood that the sign operator in the term sgn[X(n+i)] is applied on a component-by-component basis to the vector X(n), and the sine operator in the term sin ($\lambda/2\ \hat{G}_n$) is applied on a component-by-component basis to the vector $\hat{G}_n$.

Let the transpose of $\hat{G}_n$ be given by:

$$\hat{G}_n^T = [\hat{g}_0(n), \ldots, \hat{g}_{L-1}(n)], \text{ and define} \qquad$$

$$g_j(n) = E\,\{\text{sgn}[e(n)]\text{sgn}[x(n-j)]|\hat{H}_n\} \qquad (27)$$

$$= 2/\pi \arcsin(\rho_j(n)). \qquad (28)$$

Thus, $\hat{g}_j(n)$ is an estimate of $g_j(n)$, which is related to $\rho_j(n)$ by Price's Theorem. In the article entitled, "Comparison of Three Correlation Coefficient Estimators for Gaussian Stationary Processes", IEEE Trans. ASSP, Vol. ASSP-31 No. 4, August 1983, by K. J. Gabriel, it is shown that $$\text{var}\{\hat{g}_j\} = 1/N[1-(2/\pi\ arc\ \sin(\rho_j(n)))^2], \qquad (29)$$

or, on an element-by-element basis, $$\text{var}\{\hat{G}\} = 1/N[1-(2/\pi\ arc\ \sin(\rho_j(n)))^2]_j. \qquad (30)$$

According to equation (30), as N approaches infinity, the term var$\{\hat{G}\}$ approaches zero. The expected value of $\hat{\rho}_j$ is given by:

$$E\{\hat{\rho}_j(n)\} = \rho_j(n)\exp\{-\text{var}(\hat{g}_j)\pi^2/8\}. \qquad (31)$$

Again, as N approaches infinity, $E\{\hat{\rho}_j(n)\}$ approaches $\rho_j(n)$. Equation (31) can be interpreted as indicating that the expected value of the coefficient is equal to the product of the actual expected value, $\rho_j(n)$, and a function of the variance. If the coefficient update equation is rewritten as $$\hat{H}(n+N) = \hat{H}(n) + \mu[\hat{\rho}_j(n)]_j, \qquad (32)$$

then the conditional expectation of $\hat{H}(n+N)$ with respect to $\hat{H}(n)$ is equal to $$E\{\hat{H}(n+N)|\hat{H}(n)\} =$$
$$\hat{H}(n) + \mu\,\rho_j(n)\exp\{-\text{var}(\hat{g}_j)\,\pi^2/8\}_j = \qquad (33)$$
$$\hat{H}(n) +$$
$$\mu\,[\rho_j\exp\{-1/N[1-(2/\pi\cdot\arcsin(\rho_j(n)))^2]\,\pi^2/8\}]_j. \qquad (34)$$

Examining equation (34), it is apparent that as N approaches infinity, an adaptive filter based on this method behaves as a full LMS filter.

Convergence Behavior

The next aspect of the adaptive filter update method of the present invention to consider is the convergence behavior of the coefficient update equation. Let the matrix $P_n$ have a jkth element given by:

$$P_n = [\delta(j-k)\bullet\exp\{-1/n[1-(2/\pi\ arc\ \sin(\rho_j(n)))^2]\pi^2/8\}]_{jk}. \qquad (35)$$

Using equation (35), equation (34) can be rewritten as:

$$E\{\hat{H}(n+N)|\hat{H}(n)\} = \hat{H}(n) + \mu P_n\Lambda_n. \qquad (36)$$

If $H_{opt}$ is defined to be the filter coefficients which minimize the mean-square error between the adaptive filter and the characteristics of the channel, and $$V_n = \hat{H}_n - H_{opt}, \qquad (37)$$

then with $$H_{opt} = R_{xx}^{-1}R_{xy}, \qquad (38)$$

where $R_{xx}$ is the input signal covariance matrix and $R_{xy}$ is the cross-correlation vector between the input signal and the channel output, it can be shown that:

$$\Lambda(n) = E\{e(n)\,X(n)\,|\,\hat{H}(n)\} \qquad (39)$$
$$= E\{X(n)\,X^T(n)\,(\hat{H}_{opt} - H_n)\,|\,\hat{H}(n)\}$$
$$= -R_{xx}\,V_n.$$

Note that when convergence is achieved, $V_n=0$. Equation (36) can thus be expressed as:

$$E\{V_{n+N}|V_n\} = [I - \mu P_n R_{xx}]V_n. \qquad (40)$$

For purposes of comparison, it is known that the equivalent equation for the LMS update method is:

$$E\{V_{n+N}|V_n\} = [I - \mu R_{xx}]V_n, \qquad (41)$$

where in the LMS case $V_{n+N}$ is equal to $V_{n+1}$. Because the matrix $P_n=I$ as N approaches infinity, the preceding analysis indicates that the PCC update equation converges in the same manner as the LMS update equation, only N times slower because the updating occurs only once every N time samples. However, since N equaling infinity means that no adaptation occurs, this indicates that the PCC algorithm can approach, but will never be equivalent to, the convergence behavior of the LMS algorithm.

The matrix $P_n=I$ when all of the $\rho_i$ have a value of 1, which indicates a 100% correlation between the signal, X(n), and the error, e(n). This situation does not occur in practice. Furthermore, $$0 < \det\{P_n\} < 1, \text{ because}$$

$$0 < 1 - 2/\pi(arc\ \sin(\rho_j(n)))^2 < 1.$$

As a result, $$\det\{[I-\mu P_n R_{xx}]\} \leq \det\{[I-\mu R_{xx}]\}.$$

Thus, for any value of $\mu$ for which the LMS algorithm is guaranteed to converge, i.e., $0 < \mu < 1/\lambda_{max}$, the PCC algorithm will also converge, where $\lambda_{max}$ is the maximum eigenvalue of $R_{xx}$.

Steady-State Noise Analysis

Another important aspect of the present invention is the steady-state (post-convergence) noise introduced by this adaptive filter coefficient update method. Investigating the steady-state behavior leads to an understanding of the residual noise power of the adaptive filter after convergence. With an ideal analytical least-squares solution to the filtering problem, the residual noise can be expressed as:

$$\xi_{min} = E\{y^2(n)\} - R^T_{xy}H_{opt}. \qquad (42)$$

For an adaptive filter, define the variance in the filter coefficients as a result of the update equation, K(n) as:

$$K(n) = E\{V(n)V^T(n)\}. \quad (43)$$

This variance in the filter coefficients results in additional noise at the filter output, which is expressed as:

$$tr\{R_{xx}K(n)\}. \quad (44)$$

Equation (44) indicates that the additional noise term is the product of the power of the input signal and the power introduced by the variance of the coefficients. The total noise power in an adaptive filter is then:

$$\sigma_e^2(n) = E\{e^2(n)\} \quad (45)$$
$$= \xi_{min} + tr\{R_{XX}K(n)\}.$$

Thus, in an adaptive filter, the total noise power is the sum of the minimum obtainable noise in a least squares sense, $\xi_{min}$, and the noise introduced by the variance of the filter coefficients from their optimal values.

In a steady-state situation, the coefficient update vector, $\hat{\Lambda}(n)$, defines the variation of the coefficients about the mean value. Thus, the variance of the coefficients is given by the matrix:

$$\Theta_n = E\{\hat{\Lambda}(n)\hat{\Lambda}(n)^T | \hat{H}(n)\} \quad (46)$$

The jth diagonal element of $\Theta_n$ is given by:

$$E\{\sin^2(\pi/2\hat{g}_j(n))\} = \quad (47)$$

$$\tfrac{1}{2}[1-(1-2\rho_k^2)\exp\{-\pi^2/2 var(\hat{g}_j(n))\}], \quad (48)$$

where $var(\hat{g}_j(n))$ is given by equation (29). In a steady-state situation, $\rho_k^2$ is approximately equal to zero, so equation (48) reduces to:

$$E\{\sin^2(\pi/2\hat{g}_j(n))\} = \tfrac{1}{2}(1-\exp\{-\pi^2/2 N\}) \quad (49)$$

Therefore, $$tr\{R_{XX}K_n\} \approx \mu^2/2 \left(\sum_{i=1}^{L} \lambda_i\right)(1-\exp\{-\pi^2/2N\}), \quad (50)$$

where $\lambda_i$ are the eigenvalues of $R_{xx}$ and L is the number of filter coefficients. Thus, in the case of a PCC update method, equation (45) becomes:

$$\sigma_{PCC}^2(n) \approx \xi_{min} + \mu^2/2 \left(\sum_{i=1}^{L} \lambda_i\right)(1-\exp\{-\pi^2/2N\}). \quad (51)$$

The mean-square noise term for the sign algorithm (SA) can be obtained by setting N=1 in equation (51). In this case the result is:

$$\sigma_{SA}^2(n) \approx \xi_{min} + \mu^2/2 \left(\sum_{i=1}^{L} \lambda_i\right)(1-\exp\{-\pi^2/2\}). \quad (52)$$

For purposes of comparison, the well known noise term equations for the sign-error (SE) and LMS error update methods are:

$$\sigma_{SE}^2(n) \approx \xi_{min} + \mu/2 \,(\pi/2)^{1/2} \left(\sum_{i=1}^{L} \lambda_i\right) (\xi_{min})^{1/2} \quad (53)$$

$$\sigma_{LMS}^2(n) \approx \xi_{min} + \mu/2 \left(\sum_{i=1}^{L} \lambda_i\right) (\xi_{min}). \quad (54)$$

Equations (51)-(54) indicate that the excess noise introduced by using the PCC algorithm is a quadratic factor of $\mu$ and is independent of $\xi_{min}$. This means that in order to have a residual noise power in an implementation of a PCC algorithm which is equal to that of an implementation of a LMS or SE algorithm, the PCC implementation will require a larger value of $\mu$. This means that fewer bits are required for the coefficients and a more cost-effective solution is obtained.

When $\xi_{min}$ equals zero, as in the situation of an absence of additive noise corrupting the desired signal, the noise terms for the LMS and SE algorithms reduce to:

$$\sigma_{LMS}^2(\infty) = \sigma_{SE}^2(\infty) = 0,$$

while the noise term for the PCC algorithm becomes:

$$\sigma_{PCC}^2(\infty) = \mu^2/2 \left(\sum_{i=1}^{L} \lambda_i\right)(1-\exp\{-\pi^2/2N\}). \quad (55)$$

The noise term described by equation (55) can be made very small, since in practice $\mu$ is small. Note that the expression for the SA algorithm is the same as shown in equation (55) for the case where N=1.

Hardware Implementations of the Present Invention

Figure 3:
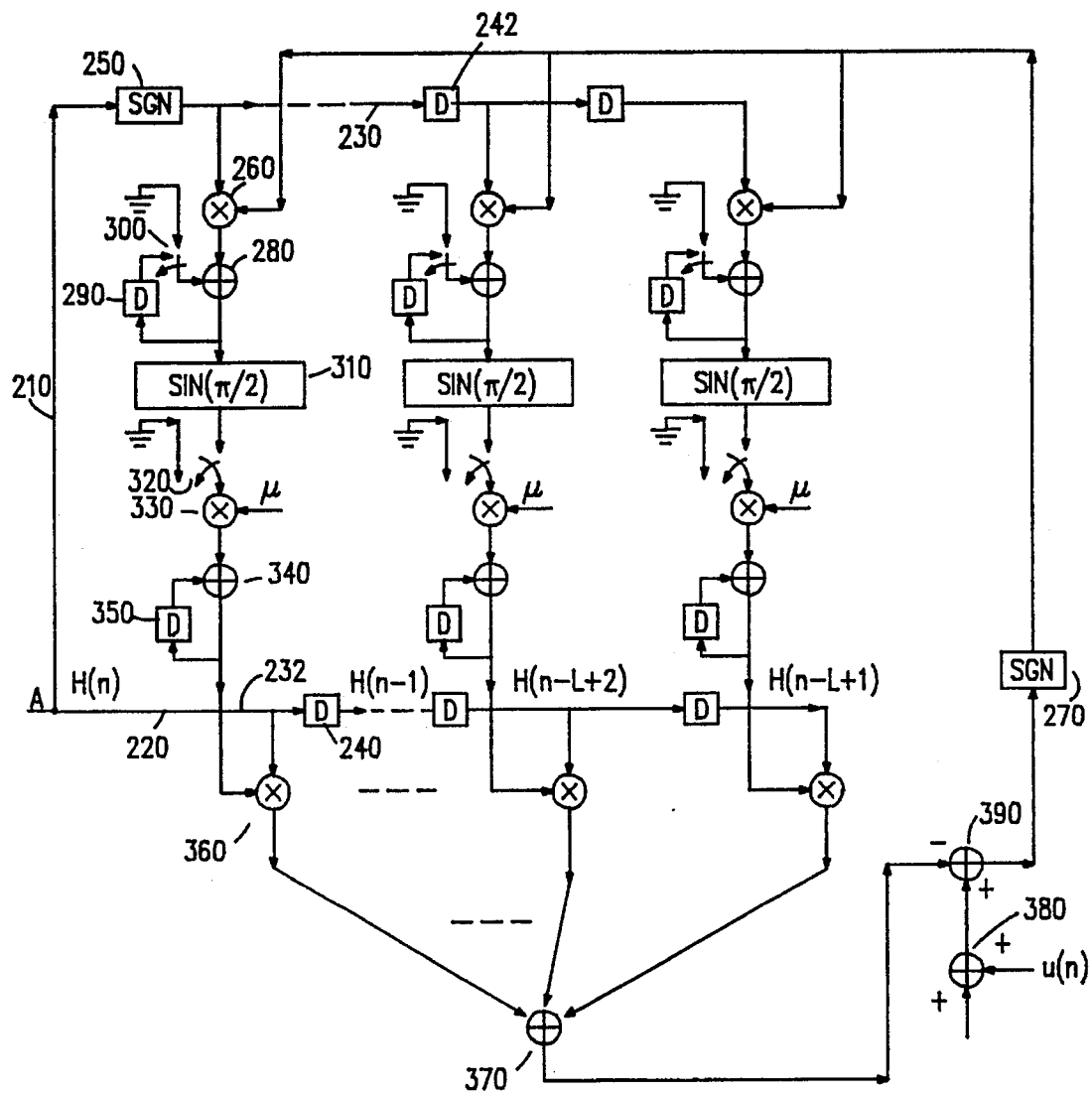
FIG. 3 is a block diagram of a direct form adaptive filter which implements the corrected polarity-coincidence algorithm of the present invention.

FIG. 3 is a block diagram of a direct form adaptive filter 200 which implements the corrected polarity-coincidence algorithm of the present invention. An input signal at time n, X(n), enters the circuit at point A. The input signal is then fed along two paths; a first path 210 which generates the updated coefficients for the adaptive filter and a second path 220 which provides the input signal for the generation of the filter output and production of the error term. Both paths 210 and 220 employ delay lines which delay the input signal by a sequence of delayers 240 and 242 so as to provide samples of the input signal at a sequence of time increments, i.e., X(n), X(n−1), X(n−2), ..., X(n−k).

Path 210 feeds the input signal to sign element 250 which performs a sign operation on the signal to produce an output corresponding to sgn[x(n)]. As noted, the output of sign element 250 is propagated through delay line 230 so that a sequence of values, sgn[x(n)], sgn[x(n−1)], ..., sgn[x(n−k)] is produced. Each sgn[x(n−k)] term is provided as one of the inputs to multipliers 260. The other input to multipliers 260 is the sign of the error signal, e(n), determined during a previous cycle of the update method. This term is produced by the operation of sign element 270 on e(n). The output of multipliers 260 are the product terms sgn[e(n)]sgn[x(n)], ..., sgn[e(n)]sgn[x(n−k)]. Since multipliers 260 are one-bit by one-bit multipliers, in practice they can be implemented as exclusive-OR (XOR) gates.

Adders 280 and delay elements 290 are combined to form integrator elements which allow multiple values of the output terms of multipliers 260 to be summed. Switches 300 are connected to ground during the first time sample of every N time sample update cycle and to the closed loop position during the remaining N−1 time samples of the update cycle. In this manner, after each N time sample cycle, the sum of N−1 output terms of multipliers 260 is produced. Thus, for each N time sample cycle, the output of the jth integrator is a term of the form:

$$\sum_{i=0}^{N-1} sgn[e(n+i)]sgn[x(n+i-j)].$$

The outputs of the integrators are fed to sine operation elements 310 which take the sine of the product of $\pi/2N$ times the integrator output. The result of this operation are the $\hat{\Lambda}(n)$ terms from equations (22) and (23). The output of elements 310 are fed through switches 320 which are connected to either ground or to multiplier elements 330. A second input to multipliers 330 is the value $\mu$, which as discussed previously, determines the convergence rate of the update equation. The outputs of multipliers 330 are thus the product of μ and the Â(n) terms. These outputs serve as the inputs for integrators formed by adders 340 and delay elements 350. Switches 320 are connected to ground for the first N–1 time samples of each N time sample cycle, and to the output of elements 310 for the Nth sample of each cycle. Thus, subject to the described operation of switches 320, the outputs of multipliers 330 are zero for every N–1 time samples, and μÂ(n) for the Nth time sample, when switch 320 is set to connect elements 310 and multipliers 330. Therefore, the output of integrators 340 is the term lq(n), which is constant for N–1 time samples, and is updated to Ĥ(n+N) at the Nth time sample.

The outputs of these integrators are provided as one of the inputs to multipliers 360, with the other input being the original input signals x(n), . . . , x(n–k) as provided by delay line 232 by virtue of the action of delay elements 240. Multipliers 360 thus have outputs which are the product of the updated filter coefficients and the sequence of delayed signal samples. The outputs of multipliers 360 are summed by adder 370, thereby providing as an output the filter output ŷ(n)=X(n)$^T$Ĥ(n). Thus, multipliers 360 and adder 370 combine to perform the convolution operation described by equation (1).

Reference signal y(n) is provided as one of the inputs to adder 380, with the other input being a term u(n), which represents additive noise in the channel of interest. The output of adder 380 serves as one of the inputs to subtractor 390 which performs a differencing operation on the filter output from adder 370 and the output from adder 380, thereby producing the error term, e(n) which corresponds to the error between the channel characteristics and the previous update of the adaptive filter. As previously noted, the output of subtractor 390 is fed through sign element 270, producing the sgn[e(n)] term which is used in the next cycle of the update equation.

Figure 4:
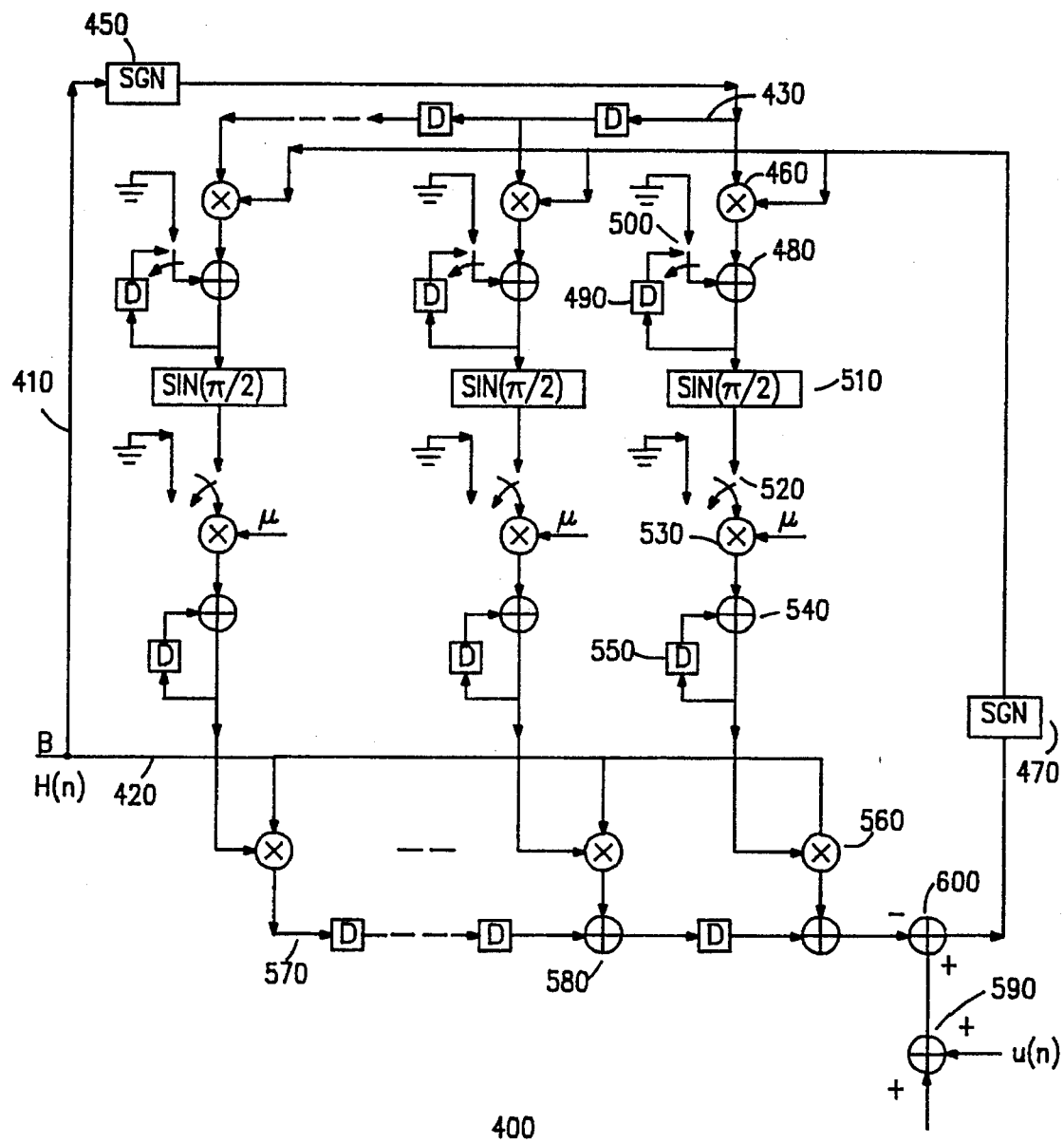
FIG. 4 is a block diagram of a second embodiment of the present invention which consists of a transpose form adaptive filter implementing the corrected polarity-coincidence algorithm of the present invention.

FIG. 4 is a block diagram of a second embodiment of the present invention which consists of a transpose form adaptive filter 400 implementing the corrected polarity-coincidence algorithm of the present invention. The input signal at time n, X(n), enters the circuit at point B. The input signal is then fed along two paths; a first path 410 which generates the updated coefficients for the adaptive filter and a second path 420 which provides the input signal for the generation of the filter output and production of the error term.

Path 410 feeds the input signal to sign element 450 which performs a sign operation on the signal to produce an output corresponding to sgn[x(n)]. The output of sign element 450 is propagated through delay line 430 so that a sequence of values, sgn[x(n)], sgn[x(n–1)], . . . , sgn[x(n–k)] is produced. Each sgn[x(n–k)] term is provided as one of the inputs to multipliers 460. The other input to multipliers 460 is the sign of the error signal, e(n), determined during a previous cycle of the update method. This term is produced by the operation of sign element 470 on e(n). The output of multipliers 460 are the product terms sgn[e(n)]sgn[x(n)], . . . , sgn[e(n)]sgn[x(n–k)].

Adders 480 and delay elements 490 are combined to form integrator elements which allow multiple values of the output terms of multipliers 460 to be summed. Switches 500 are connected to ground during the first time sample of every N time sample update cycle and to the closed loop position during the remaining N–1 time samples of the update cycle. In this manner, after each N time sample cycle, the sum of N–1 output terms of multipliers 460 is produced. Thus, for each N time sample cycle, the output of the jth integrator is a term of the form:

$$\sum_{i=0}^{N-1} \text{sgn}[e(n+i)]\text{sgn}[x(n+i-j)].$$

The outputs of the integrators are fed to sine operation elements 510 which take the sine of the product of π/2N times the integrator output. Again, the result of this operation are the Â(n) terms from equations (22) and (23). The output of elements 510 are fed through switches 520 which are connected to either ground or to multiplier elements 530. A second input to multipliers 530 is the value μ, which as discussed previously, determines the convergence rate of the update equation. The outputs of multipliers 530 are thus the product of μ and the Â(n) terms. These outputs serve as the inputs for integrators formed by adders 540 and delay elements 550. Switches 520 are connected to ground for the first N–1 time samples of each N time sample cycle, and to the output of elements 510 for the Nth sample of each cycle. Thus, subject to the described operation of switches 520, the outputs of multipliers 530 are zero for every N–1 time samples, and μÂ(n) for the Nth time sample, when switch 520 is set to connect elements 510 and multipliers 530. Therefore, the output of integrators 540 is the term lq(n), which is constant for N–1 time samples, and is updated to Ĥ(n+N) at the Nth time sample.

The outputs of these integrators are provided as one of the inputs to multipliers 560, with the other input being the original input signal x(n), as provided by line 420. Note that in this embodiment of the present invention, the input signals are not delayed prior to being combined with the updated coefficients, as occurred in the embodiment described with reference to FIG. 3. The output of multipliers 560 is the product of the updated filter coefficients and the signal. The outputs of multipliers 560 are delayed by delay line 570, with the delayed terms being progressively summed by adders 580. The final result is the filter output ŷ(n)=X(n)$^T$Ĥ(n). Thus, in this embodiment, multipliers 560 and adders 580 combine to perform the convolution operation described by equation (1).

Reference signal y(n) is provided as one of the inputs to adder 590, with the other input being a term u(n) which represents additive noise in the channel of interest. The output of adder 590 serves as one of the inputs to subtractor 600 which performs a differencing operation on the filter output from adders 580 and the output from adder 590, thereby producing the error term, e(n) which corresponds to the error between the channel characteristics and the previous update of the adaptive filter. As previously noted, the error term is fed through sign element 470, producing the sgn[e(n)] term which is used in the next cycle of the update equation.

The behavior of the transform form embodiment of FIG. 4 in the steady state is similar to that of the direct form embodiment of FIG. 3. However, the convergence characteristics differ due to the effects of delay line 570 in propagating the filter coefficient updates to the filter output where subtractor 600 forms the error term.

By way of comparison, in the transpose form, the LMS update method becomes expensive to implement because the input signals X(n–k) must be stored in a delay line. This removes the benefit of using the transpose form filter in the first place. In contrast, in the transpose form of the PCC update method described with respect to FIG. 4, the delay line which stores the sequence of sgn[X(n–k)] terms can be implemented as a one-bit wide shift register.

With the architecture described in FIG. 4, and with PCC based architectures in general, analog implementation of an adaptive filter becomes simpler than for LMS based filters.

For example, the shaded portion of FIG. 4 can be implemented in digital technology, while the rest of the device can be analog. The adaptive component of the filter takes a simple, yet precise form, while the convolution required between the input signal, x(n), and the filter coefficients, $h_j(n)$, can be performed at high speed in the analog domain. This eliminates the need to use relatively slow digital multipliers or expensive analog-to-digital converters.

The PCC based adaptive filters described with respect to FIGS. 3 and 4 assume a gaussian input signal. However, in many applications a feed-forward adaptive filter is used as a channel equalizer, with the channel being driven by a non-gaussian, M-ary signal. When channel distortion exists, inter-symbol interference (isi) results, with the received signal being asymptotically gaussian with increasing distortion. However, this is not a problem with the present invention, as the architectures of both FIGS. 3 and 4 can be employed as feed-forward equalizers which will function accurately.

In accordance with the present invention, there has been described a method of updating the coefficients of an adaptive filter which removes the distortion normally present in a PCC algorithm, while realizing many of the desireable convergence features of the LMS algorithm. The update algorithm of the present invention is simpler and less expensive to implement than an adaptive filter based on the full LMS algorithm, and for many applications the slower convergence is not a detriment to its use.

Although the convergence of the PCC adaptive filter is slower than LMS by a factor of N time samples, it has a very robust convergence, unlike that of a sign-sign method. The noise in the steady state does not depend on $\xi_{min}$ and can be made to approach the theoretical minimum. The present invention is easily applied to analog architectures and does not require the use of analog-to-digital converters. Analog applications require only two comparators for signal and error quantization, and in most applications, an all analog architecture will enable the invention to be implemented on a single chip. The sin ($\pi/2$) correction used in the present invention can be implemented as a look-up table or in boolean logic. Since the function sin ($\pi/2x$) is symmetric, only half of its values need to be stored in a look-up table. The sign of the table input and output can then be manipulated to obtain the full range of values.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

I claim:

1. A processing system for iteratively updating the coefficients of an adaptive filter which uses a polarity-coincidence correlator, in order to remove a distortion inherent in the correlator, the system comprising:

storage means for storing a first set of coefficients of an adaptive filter;

processing means for determining a second set of coefficients for the adaptive filter, wherein the second set of coefficients is dependent upon the first set of coefficients and is related to the first set by a coefficient update equation which includes a term representing a change in a value of each coefficient in the first set of coefficients, the update equation being a friction of a polarity-coincidence correlator and being modified to remove a distortion term which affects a convergence of the update equation; and control means for storing the second set of adaptive filter coefficients in the storage means.

2. The processing system of claim 1, wherein the processing means further comprises:

integrator means having an input and an output, the input being terms representing a sign of an input signal and a sign of an error term, the output being a sum of multiple values of the input;

distortion correction means having an input and an output, the input being the output of the integrator means, and the output being a modified output of the integrator means which has been corrected to remove a distortion in the output; and means for calculating the second set of filter coefficients based on the output of the distortion correcting means and the first set of filter coefficients.

3. The processing system of claim 2, wherein the coefficient update equation for the adaptive filter is represented by the form:

$$\hat{H}(n+N)=\hat{H}(n)+\delta\hat{H}(n),$$

where $\hat{H}(n+N)$ is a value of an adaptive filter coefficient when a variable n equals n+N, $\hat{H}(n)$ is the value of the adaptive filter coefficient when the variable n equals n and corresponds to the first set of filter coefficients, and $\delta\hat{H}(n)$ is a change in the value of $\hat{H}(n)$, with $\delta\hat{H}(n)$ represented by a polarity-coincidence correlator of the form:

$$\text{sgn}[e(n)]\text{sgn}[X(n+i)],$$

where sgn[ ] represents the sign of an expression contained in brackets [ ], e(n) is an error term produced in the iterative updating of the filter coefficient, and X(n+i) is a value of a signal being input to the filter at time n+i.

4. The processing system of claim 3, wherein $\delta\hat{H}(n)$ is modified according to:

$$\hat{H}(n+j)=\hat{H}(n) \text{ for } j=1,\ldots,N-1,$$

and $$\delta\hat{H}(n)=\mu\hat{\Lambda}(n) \text{ for } J=N,$$

where $\mu$ is a convergence parameter and $$\hat{\Lambda}(n) = \left[ \sin\left( \pi/2 \left( 1/N \sum_{i=0}^{N-1} \text{sgn}[e(n+i)]\text{sgn}[X(n+i-j)] \right) \right) \right].$$

5. A method of iteratively updating the coefficients of an adaptive filter which uses a polarity-coincidence correlator, in order to remove a distortion inherent in the correlator, the method comprising:

storing a first set of adaptive filter coefficients in a storage element;

representing a coefficient update equation for the adaptive filter by the form $$\hat{H}(n+N)=\hat{H}(n)+\delta\hat{H}(n),$$

where $\hat{H}(n+N)$ is a value of an adaptive filter coefficient when a variable n equals n+N, $\hat{H}(n)$ is the value of the adaptive filter coefficient when the variable n equals n and corresponds to the first set of filter coefficients, and $\delta\hat{H}(n)$ is a change in the value of $\hat{H}(n)$;

representing $\delta\hat{H}(n)$ by a polarity-coincidence correlator of the form $$\text{sgn}[e(n)]\text{sgn}[X(n+i)],$$

where sgn[ ] represents the sign of an expression contained in brackets [ ], e(n) is an error term produced in the iterative updating of the filter coefficient, and X(n+i) is a value of a signal being input to the filter at time n+i;

modifying $\delta\hat{H}(n)$ to remove a distortion term which affects a convergence of the iterative update of the coefficient;

generating a second set of updated adaptive filter coefficients by applying the coefficient update equation, where the first set of coefficients corresponds to the $\hat{H}(n)$ terms of the update equation and the second set of coefficients corresponds to the $\hat{H}(n+N)$ terms of the update equation; and storing the second set of adaptive filter coefficients in the storage element.

6. The iterative update method of claim 5, wherein the modification of $\delta\hat{H}(n)$ produces a coefficient update equation which has convergence behavior substantially equivalent to that of a LMS update equation.

7. The iterative update method of claim 5, wherein $\delta\hat{H}(n)$ is modified according to:

$$\hat{H}(n+j)=\hat{H}(n) \text{ for } j=1,\ldots,N-1,$$

and $$\delta\hat{H}(n)=\mu\hat{A}(n) \text{ for } j=N,$$

where $\mu$ is a convergence parameter and $$\hat{A}(n) = \left[\sin\left(\pi/2\left(1/N\sum_{i=0}^{N-1}\text{sgn}[e(n+i)]\text{sgn}[X(n+i-j)]\right)\right)\right].$$

8. An adaptive filter which includes a polarity-coincidence correlator and which removes a distortion inherent in the correlator, the adaptive filter comprising:

means for directing an input signal along each of a first and a second input signal paths;

sign operation means having an input and an output, the input being the signal directed along the first signal path and the output being the result of performing a sign operation on the input;

first multiplier means having a first input, a second input, and an output, the first input being the output of the sign operation means and the second input being a result of performing a sign operation on an error signal, and the output being the product of the first and second inputs;

integrator means for producing an output by summing multiple values of the output of the multiplier means;

sine operation means having an input and an output, the input being the output of the integrator means, and the output being the result of applying the sine operation to the input;

second multiplier means having a first input, a second input, and an output, the first input being the output of the sine operation means and the second input being a convergence rate parameter, and the output being the product of the first and second inputs; and third multiplier means having a first input, a second input, and an output, the first input being the output of the second multiplier means and the second input being the signal directed along the second input signal path, and the output being the product of the first and second inputs.

9. The adaptive filter of claim 8, further comprising:

comparator means for comparing the output of the third multiplier means to a reference signal, thereby producing the error signal.

* * * * *

UNITED STATES PATENT AND TRADEMARK OFFICE
CERTIFICATE OF CORRECTION

PATENT NO. : 5,568,411
DATED : October 22, 1996
INVENTOR(S) : Roy George Batruni It is certified that error appears in the above-indentified patent and that said Letters Patent is hereby corrected as shown below:

In Col. 13, line 64, delete "friction" and replace with --function--.

In Col. 14, line 41, in the equation, delete "J" and replace with --j--.

Signed and Sealed this

Seventh Day of January, 1997

Attest:

BRUCE LEHMAN

Attesting Officer     Commissioner of Patents and Trademarks